United States Patent
Yang et al.

(10) Patent No.: US 9,201,276 B2
(45) Date of Patent: Dec. 1, 2015

(54) PROCESS ARCHITECTURE FOR COLOR FILTER ARRAY IN ACTIVE MATRIX LIQUID CRYSTAL DISPLAY

(71) Applicant: Apple Inc., Cupertino, CA (US)

(72) Inventors: Young Cheol Yang, Sunnyvale, CA (US); Young Bae Park, Cupertino, CA (US); Cheng Chen, San Jose, CA (US); John Z. Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 395 days.

(21) Appl. No.: 13/654,256

(22) Filed: Oct. 17, 2012

(65) Prior Publication Data

US 2014/0104527 A1   Apr. 17, 2014

(51) Int. Cl.
| | |
|---|---|
| G02F 1/1343 | (2006.01) |
| G02F 1/1333 | (2006.01) |
| G02F 1/1335 | (2006.01) |
| H01L 27/12 | (2006.01) |
| G02F 1/1362 | (2006.01) |

(52) U.S. Cl.
CPC .... *G02F 1/134363* (2013.01); *G02F 1/133512* (2013.01); *G02F 1/133514* (2013.01); *G02F 1/136227* (2013.01); *H01L 27/1225* (2013.01); *G02F 1/133345* (2013.01); *G02F 2001/134372* (2013.01); *G02F 2001/136222* (2013.01)

(58) Field of Classification Search
CPC ............ G02F 1/134363; G02F 1/1368; G02F 1/133512; G02F 1/133514
USPC ....................... 349/42–43, 141, 106–108, 110
See application file for complete search history.

(56) References Cited

U.S. PATENT DOCUMENTS

| | | | |
|---|---|---|---|
| 4,080,619 | A | 3/1978 | Suzuki |
| 4,958,205 | A | 9/1990 | Takeda et al. |
| 5,075,237 | A | 12/1991 | Wu |
| 5,642,129 | A | 6/1997 | Zavracky et al. |
| 5,668,613 | A | 9/1997 | Kim et al. |
| 5,698,902 | A | 12/1997 | Uehara et al. |
| 5,721,155 | A | 2/1998 | Lee |
| 5,990,492 | A | 11/1999 | Kim et al. |
| 5,994,721 | A | 11/1999 | Zhong et al. |
| 6,246,179 | B1 | 6/2001 | Yamada |
| 6,372,636 | B1 | 4/2002 | Chooi et al. |

(Continued)

FOREIGN PATENT DOCUMENTS

| | | |
|---|---|---|
| EP | 0376329 | 7/1990 |
| EP | 2048538 | 4/2009 |

(Continued)

*Primary Examiner* — Dung Nguyen

(57) ABSTRACT

An active matrix liquid crystal display having an array of pixels is provided. The display includes a thin film transistor (TFT) for each pixel. The TFT has a gate electrode, a source electrode overlapping with a first area of the gate electrode, and a drain electrode overlapping with a second area with the gate electrode. The display also includes a color filter layer disposed over the TFT. The color filter layer has a first via hole to expose a portion of the drain electrode. The display further includes a metal layer disposed over the color filter layer and covering the gate electrode. The metal layer is configured to connect to the drain electrode through the first via hole. The display also includes an organic insulator layer disposed over the metal layer. The organic insulator layer has a second via hole to expose a first portion of the metal layer and a third via hole to expose a second portion of the metal layer.

42 Claims, 13 Drawing Sheets

(56) References Cited

U.S. PATENT DOCUMENTS

| | | | |
|---|---|---|---|
| 6,406,928 B1 | 6/2002 | Jen | |
| 6,479,398 B1 | 11/2002 | Chen, Jr. | |
| 6,509,614 B1 | 1/2003 | Shih | |
| 6,525,342 B2 | 2/2003 | Amemiya | |
| 6,548,960 B2 | 4/2003 | Inukai | |
| 6,613,620 B2 | 9/2003 | Fujimoto et al. | |
| 6,686,273 B2 | 2/2004 | Hsu et al. | |
| 6,768,531 B2 * | 7/2004 | Ochiai et al. | 349/141 |
| 6,812,637 B2 | 11/2004 | Cok et al. | |
| 6,967,407 B2 | 11/2005 | Otani et al. | |
| 7,030,553 B2 | 4/2006 | Winters et al. | |
| 7,045,406 B2 | 5/2006 | Huotari et al. | |
| 7,129,634 B2 | 10/2006 | Boroson et al. | |
| 7,190,419 B2 * | 3/2007 | Park | 349/43 |
| 7,199,518 B2 | 4/2007 | Couillard | |
| 7,209,057 B2 | 4/2007 | Hashido et al. | |
| 7,227,542 B2 | 6/2007 | Koyama | |
| 7,402,468 B2 | 7/2008 | Park et al. | |
| 7,419,858 B2 | 9/2008 | Schuele et al. | |
| 7,510,891 B2 | 3/2009 | Chun et al. | |
| 7,550,306 B2 | 6/2009 | Park et al. | |
| 7,553,707 B2 | 6/2009 | Horino et al. | |
| 7,563,669 B2 | 7/2009 | Chittipeddi et al. | |
| 7,602,456 B2 | 10/2009 | Tanaka | |
| 7,609,342 B2 | 10/2009 | Yang et al. | |
| 7,671,939 B2 | 3/2010 | Araki et al. | |
| 7,759,857 B2 | 7/2010 | Vaufrey et al. | |
| 7,816,677 B2 | 10/2010 | Lee et al. | |
| 7,843,130 B2 | 11/2010 | Shimizu et al. | |
| 7,855,508 B2 | 12/2010 | Cok et al. | |
| 7,919,918 B2 | 4/2011 | Kim | |
| 7,952,104 B2 | 5/2011 | Leonardi et al. | |
| 7,956,825 B2 | 6/2011 | Kane | |
| 7,969,087 B2 | 6/2011 | Hwang et al. | |
| 7,973,470 B2 | 7/2011 | Cok | |
| 8,053,978 B2 | 11/2011 | Hwang et al. | |
| 8,064,028 B2 | 11/2011 | Katayama et al. | |
| 8,072,080 B2 | 12/2011 | Moriwaki | |
| 8,089,429 B2 | 1/2012 | Yamashita et al. | |
| 8,102,338 B2 | 1/2012 | Hwang et al. | |
| 8,133,748 B2 | 3/2012 | Yamazaki et al. | |
| 8,236,628 B2 | 8/2012 | Liu et al. | |
| 8,278,162 B2 | 10/2012 | Akimoto et al. | |
| 8,278,661 B2 | 10/2012 | Song | |
| 8,294,147 B2 | 10/2012 | Yamazaki et al. | |
| 8,297,991 B2 | 10/2012 | Adachi | |
| 8,339,531 B2 | 12/2012 | Yamauchi | |
| 8,363,197 B2 | 1/2013 | Matsuda et al. | |
| 8,368,674 B2 | 2/2013 | Kim et al. | |
| 8,377,762 B2 | 2/2013 | Eguchi et al. | |
| 8,427,607 B2 | 4/2013 | Lee et al. | |
| 8,455,872 B2 | 6/2013 | French | |
| 8,471,256 B2 | 6/2013 | Yamazaki et al. | |
| 8,508,562 B2 | 8/2013 | Akimoto et al. | |
| 8,508,709 B2 | 8/2013 | Huang et al. | |
| 8,552,655 B2 | 10/2013 | Ono | |
| 8,568,877 B2 | 10/2013 | Ferrari et al. | |
| 8,610,860 B2 | 12/2013 | Huang et al. | |
| 8,692,743 B2 | 4/2014 | Tsai et al. | |
| 8,859,947 B2 | 10/2014 | Adachi | |
| 8,890,187 B2 * | 11/2014 | Arasawa | 349/110 |
| 2003/0076282 A1 | 4/2003 | Ikeda et al. | |
| 2007/0268229 A1 | 11/2007 | Kang et al. | |
| 2008/0252202 A1 | 10/2008 | Li et al. | |
| 2009/0102052 A1 | 4/2009 | Ryu | |
| 2010/0156771 A1 | 6/2010 | Lee et al. | |
| 2010/0330811 A1 | 12/2010 | Nagao | |
| 2011/0012125 A1 | 1/2011 | Nicholas | |
| 2011/0227850 A1 | 9/2011 | Oh et al. | |
| 2012/0087460 A1 | 4/2012 | Moriwaki | |
| 2012/0105495 A1 | 5/2012 | Choi | |
| 2012/0119211 A1 | 5/2012 | Lin | |
| 2012/0205658 A1 | 8/2012 | Yamazaki et al. | |
| 2012/0248455 A1 | 10/2012 | Van Gestel | |
| 2012/0268396 A1 | 10/2012 | Kim et al. | |
| 2012/0299976 A1 | 11/2012 | Chen et al. | |
| 2013/0027646 A1 | 1/2013 | Cho et al. | |
| 2013/0069061 A1 | 3/2013 | Nakazawa | |
| 2013/0161622 A1 | 6/2013 | Lee | |
| 2013/0328053 A1 | 12/2013 | Roudbari et al. | |
| 2013/0335658 A1 | 12/2013 | Huang et al. | |
| 2013/0337596 A1 | 12/2013 | Hung et al. | |
| 2014/0061656 A1 | 3/2014 | Yu et al. | |
| 2014/0070225 A1 | 3/2014 | Yu et al. | |
| 2014/0084292 A1 | 3/2014 | Hung et al. | |
| 2014/0091390 A1 | 4/2014 | Hung et al. | |
| 2014/0103349 A1 | 4/2014 | Yu et al. | |
| 2014/0120657 A1 | 5/2014 | Hung et al. | |
| 2014/0203245 A1 | 7/2014 | Gupta et al. | |
| 2014/0204067 A1 | 7/2014 | Gupta | |
| 2014/0211120 A1 | 7/2014 | Yang et al. | |
| 2014/0225117 A1 | 8/2014 | Roudbari et al. | |
| 2014/0252317 A1 | 9/2014 | Gupta et al. | |

FOREIGN PATENT DOCUMENTS

| | | |
|---|---|---|
| JP | 2010056015 | 3/2010 |
| TW | 201142797 | 12/2011 |
| WO | WO 2011/030620 | 3/2011 |
| WO | WO 2011/151970 | 12/2011 |

* cited by examiner

PROCESS ARCHITECTURE FOR COLOR FILTER ARRAY IN ACTIVE MATRIX LIQUID CRYSTAL DISPLAY

TECHNICAL FIELD

The present invention generally relates to process architecture for color filter array (COA) in active matrix liquid crystal display (AMLCD). More specifically, the invention relates to reducing thickness of color filter array for enhanced performance of the AMLCD.

BACKGROUND

Liquid crystal displays (LCDs) generally display images by transmitting or blocking light through the action of liquid crystals. LCDs have been used in a variety of computing displays and devices, including notebook computers, desktop computers, tablet computing devices, mobile phones (including smart phones) automobile in-cabin displays, on appliances, as televisions, and so on. LCDs often use an active matrix to drive liquid crystals in a pixel region. In some LCDs, a thin-film transistor (TFT) is used as a switching element in the active matrix.

For fabrication of the AMLCD, the conventional manufacturing process selectively uses a relatively thick color filter, because its dielectric constant is normally about twice of the dielectric constant of a photoactive compound (PAC), which has a relatively low dielectric constant. Generally, the color filter array is about 3 µm to 4 µm thick. Such a large thickness of the color filter array (COA) reduces the coupling between common electrode and data line (CD). This CD coupling depends upon the capacitance between common electrode and the data line, and is proportional to the dielectric constant of the color filter, and is inversely proportional to the thickness of the color filter.

There are several issues with thicker COA for fringe field switching (FFS) mode. First, it is difficult to coat a thick COA. Second, the large thickness of the COA may require alignment of the color filter array with TFTs, which is an additional step in the process. Third, the large thickness of the color filter array also makes difficult to fill via holes such that the via holes need to be larger to enable completely filling the via holes. Fourth, larger via hole sizes may be required as a result of thicker COA. The larger via holes may reduce a ratio of aperture area to via hole area, which reduces the optical transmission or brightness of the AMLCD. Additionally, the deep via holes may cause non-uniformity in a planarization layer that covers the via holes and the color filter array. Liquid crystal molecules are arranged on the top of the planarization layer.

Therefore, it is desirable to develop techniques to reduce the thickness of the COA and to improve optical transmission and performance of the AMLCD.

SUMMARY

Embodiments described herein may provide a design architecture for the color filter array (COA) in active matrix liquid crystal display (AMLCD). Embodiments also provide a process architecture for fabrication of such AMLCD.

In one embodiment, an active matrix liquid crystal display having an array of pixels is provided. The display includes a thin film transistor (TFT) for each pixel. The TFT has a gate electrode, a source electrode overlapping with a first area of the gate electrode, and a drain electrode overlapping with a second area with the gate electrode. The display also includes a color filter layer disposed over the TFT. The color filter layer has a first via hole to expose a portion of the drain electrode. The display further includes a metal layer disposed over the color filter layer and covering the gate electrode. The metal layer is configured to connect to the drain electrode through the first via hole. The display also includes an organic insulator layer disposed over the metal layer. The organic insulator layer has a second via hole to expose a first portion of the metal layer and a third via hole to expose a second portion of the metal layer.

In another embodiment, an active matrix liquid crystal display having an array of pixels is provided. The display includes a TFT for each pixel. The TFT has a gate electrode, a source electrode overlapping a first area with the gate electrode, and a drain electrode overlapping with a second area with the gate electrode. The display also includes an organic insulator layer disposed over the TFT. The organic insulator layer has a first via hole to expose a portion of the drain electrode. The display further includes a metal layer disposed over the organic insulator layer and covering the gate electrode. The metal layer is configured to connect to the drain electrode through the first via hole. The display also includes a color filter layer disposed over the metal layer. The color filter layer has a second via hole to expose a portion of the metal layer and a third via hole to expose a second portion of the metal layer.

In yet another embodiment, a method for fabricating an active matrix liquid crystal display is provided. The method includes forming a thin film transistor (TFT) over a substrate. The TFT has a gate electrode, a source electrode overlapping with a first area of the gate electrode, and a drain electrode overlapping with a second area with the gate electrode. The method also includes depositing a color filter layer over the TFT. The color filter has at least a first via hole to expose a portion of the drain electrode. The method further includes forming a metal layer over the color filter. The metal layer fills the first via hole to connect to the drain electrode. The method also includes depositing an organic insulator layer over the metal layer. The organic insulator layer has a second via hole to expose a first portion of the metal layer and a third via hole to expose a second portion of the metal layer. The method further includes forming a common electrode over the organic insulator. The common electrode is connected to the metal layer through the third via hole. The method also includes depositing a first passivation layer over the common electrode. The second via hole is through the first passivation layer. The method further includes forming a pixel electrode over the first passivation layer. The pixel electrode is connected to the metal layer through the second via hole.

In still yet another embodiment, a method for fabricating an active matrix liquid crystal display is provided. The method includes forming a thin film transistor (TFT) over a substrate. The TFT has a gate electrode, a source electrode overlapping with a first area of the gate electrode, and a drain electrode overlapping with a second area with the gate electrode. The method also includes depositing an organic insulator over the TFT. The organic insulator has a first via hole to expose a portion of the drain electrode. The method further includes forming a metal layer over the organic insulator. The metal layer fills the first via hole. The method also includes depositing a color filter layer over the metal layer. The color filter has a second via hole to expose a first portion of the metal layer and a third via hole to expose a second portion of the metal layer. The method further includes forming a common electrode over the organic insulator. The common electrode is connected to the metal layer through the third via hole. The method also includes depositing a first passivation layer over the common electrode. The second via hole is through the first passivation layer. The method further includes forming a pixel electrode over the first passivation layer. The pixel electrode is connected to the metal layer through the second via hole.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

DETAILED DESCRIPTION

The present disclosure may be understood by reference to the following detailed description, taken in conjunction with the drawings as described below. It is noted that, for purposes of illustrative clarity, certain elements in various drawings may not be drawn to scale.

The present disclosure provides a design architecture for the AMLCD, which includes a third metal layer and also an organic insulator layer in the AMLCD. The design architecture allows the thickness of the color filter layer to be reduced. The present disclosure also provides a sample process architecture for fabricating various embodiments.

Figure 1:
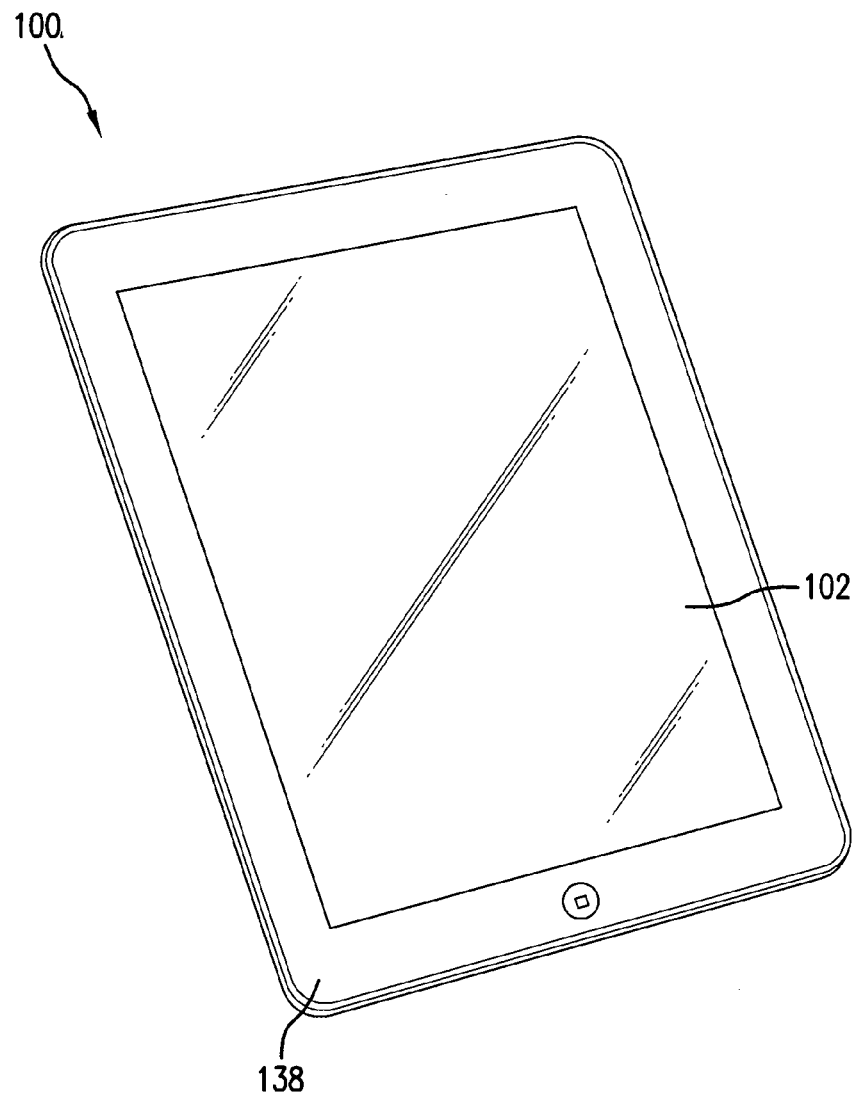
FIG. 1 illustrates a perspective view of a sample electronic device.

FIG. 1 illustrates a perspective view of a sample electronic device, such as a tablet computer. The electronic device includes a touch screen display 100 enclosed by a housing 138. The touch screen display 100A incorporates a cover glass 102 and an LCD 100B behind the cover glass 102, although alternative embodiments may employ an organic light-emitting display (OLED) layer instead of an LCD. The LCD 100B is not shown in FIG. 1A.

Figure 2:
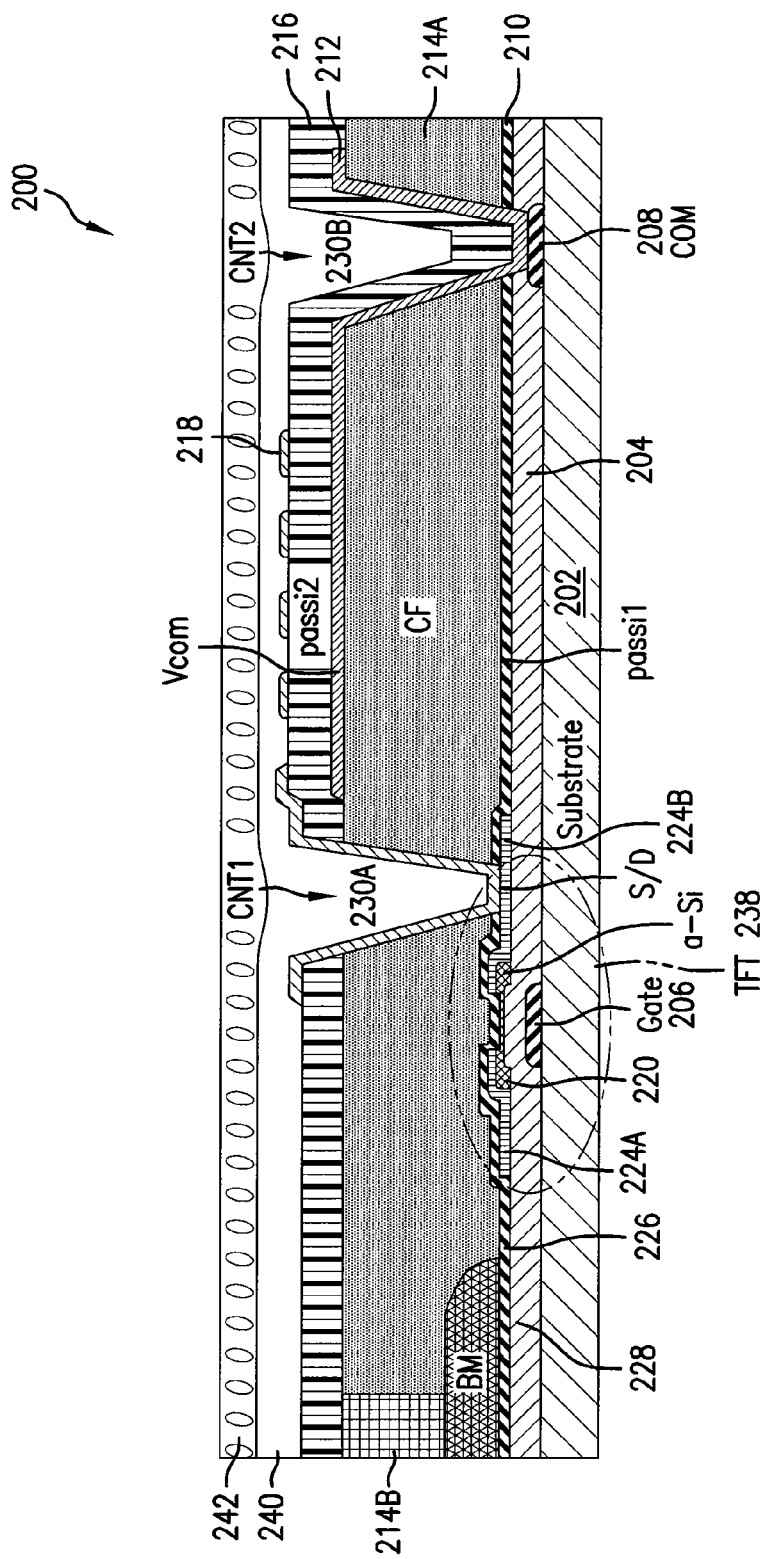
FIG. 2 shows a cross-sectional view of the TFT/CF/LC stack of a conventional AMLCD (prior art).

FIG. 2 shows a cross-sectional view of a TFT/CF/LC stack of a conventional AMLCD (prior art). TFT/CF/LC stack 200 includes a TFT 238 which includes a gate electrode 206 disposed over a substrate 202, a source electrode 224A, and a drain electrode 224B. The gate electrode 206 is also referred as a first metal layer, and the source/drain electrodes are referred as a second metal layer. The TFT/CF/LC stack 200 also includes a gate insulator 204 disposed over the gate electrode 206, a semiconductor layer 220, over the gate insulator 204. The semiconductor layer 220 connects to the source electrode 224A and drain electrode 224B. The TFT/CF/LC stack 200 further includes a first passivation layer 210 over the source electrode 224A and drain electrode 224B.

The TFT/CF/LC stack 200 further includes a CF layer 214 and a black matrix 228 disposed over the first passivation layer 210. The CF layer 214 includes a number of sub-color filters (CF), such as red, green and blue colors. The black matrix 228 may be arranged to divide the CF layer 214 into the sub-color filters. Some embodiments may replace one or more of the red, green and blue filters with a yellow filter, a cyan filter, a clear filter, or another color filter. Further, the number of color filters and their arrangement may vary in certain embodiments.

The common electrode 208 is disposed over the substrate 202 and is arranged under the color filter 214. The TFT/CF/LC stack 200 further includes a polyimide layer disposed over the pixel electrode to provide a flat surface of deposition of liquid crystal molecules, and a liquid crystal (LC) layer 242 on top of the polyimide layer 240.

Figure 3A:
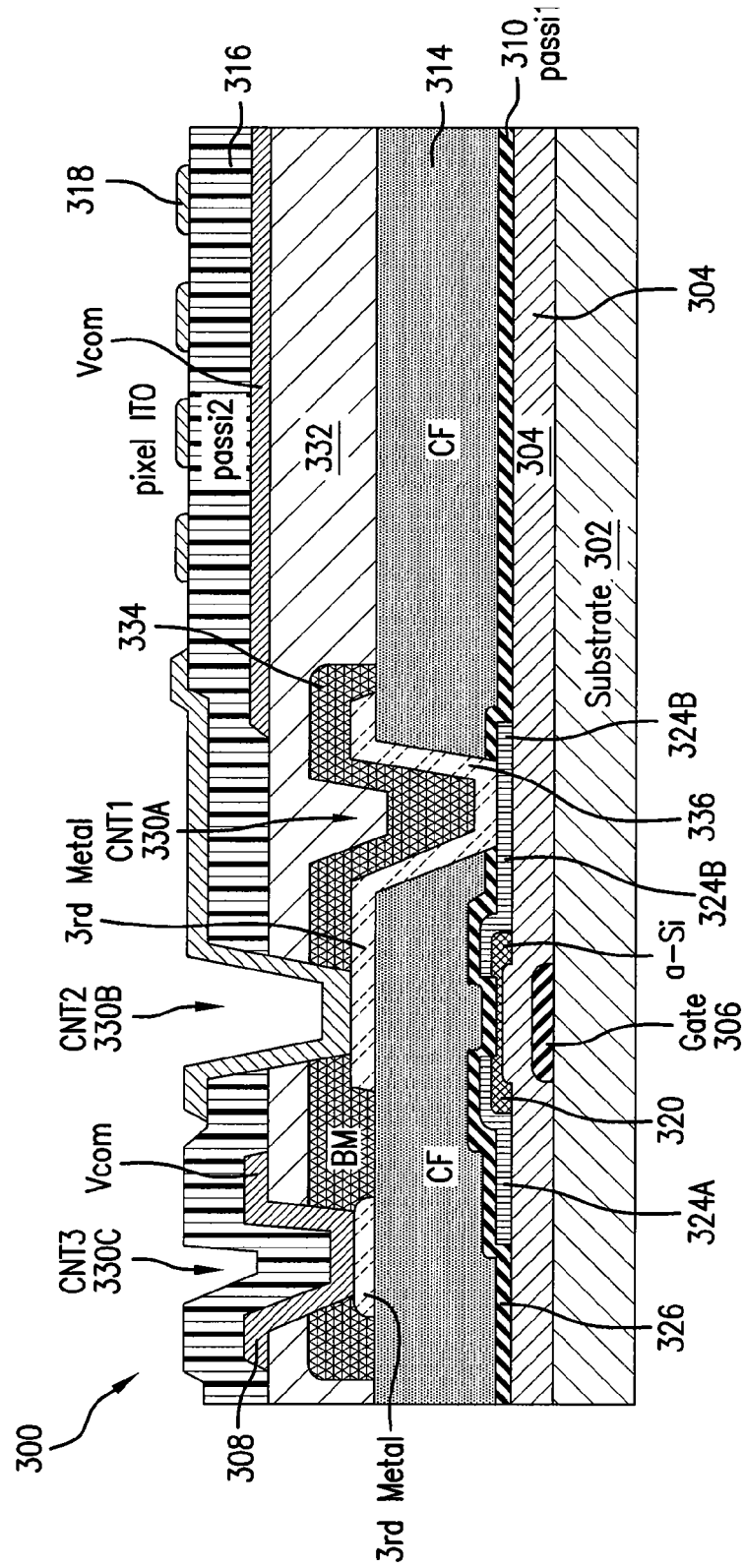
FIG. 3A shows a cross-sectional view of the TFT/CF stack of the liquid crystal display in a first embodiment of the present disclosure.

FIG. 3A shows an exploded cross-sectional view of a TFT/CF stack of the AMLCD in a first embodiment. TFT/CF stack 300 includes a TFT 338 which includes a gate electrode 306 disposed over a substrate 302, a source electrode 324A, and a drain electrode 324B. The gate electrode 306 is also referred as a first metal layer, and the source/drain electrodes are referred as a second metal layer. The TFT/CF stack 300 also includes a gate insulator 304 disposed over the gate electrode 306, a semiconductor layer 320, over the gate insulator 304. The semiconductor layer 320 connects to the source electrode 324A and drain electrode 324B. The TFT/CF stack 300 further includes a first passivation layer 310 over the source electrode 324A and drain electrode 324B. The TFT/CF stack 300 further includes a CF layer 314 disposed over the first passivation layer 310, and a third metal layer 336 over the color filter 314.

The third metal layer 336 covers at least a portion of TFT 338, such that there is no photo-leakage when the TFT is in an off-current state. The TFT 338 is arranged to be outside the pixel region or aperture area rather than within the aperture area, which further helps improve optical transmission of the AMLCD.

The TFT/CF stack 300 further includes a black matrix layer 334 disposed over the third metal layer 336. The black matrix layer 334 is photo-insensitive and has a low overall dimension. For example, it may be very thin and small in area. The black matrix layer 334 may cover at least a portion of the third metal layer 336 and may block light reflected from the third metal layer. In one embodiment, the black matrix may be made of a polymer, such as polyimide. The black matrix layer 334 may reduce light reflected from the LCD panel by absorbing the light and may also reduce optical transmission of the backlight. Therefore, the black matrix layer 334 may be configured to help block light reflection from the third metal layer while retaining optical transmission of a backlight. Note that this black matrix layer 334 is different from the black matrix 228 which is arranged between two sub-color filters 214A and 214B, as shown in FIG. 2. The black matrix 228 is also present in the TFT/CF stack 300, but not shown in FIG. 3A.

The TFT/CF stack 300 further includes an organic insulator layer 332 disposed over the black matrix layer 334. By including the organic insulator 332, the color filter layer 314 of the present TFT/CF stack 300 becomes thinner than that of conventional TFT/CF stack 200, because a combination of the organic insulator and a thinner color filter layer provides equivalent CD coupling to that of a thicker color filter layer of a conventional TFT/CF stack. Additionally, the organic insulator has a lower dielectric constant than the color filter, which also helps make the color filter thinner for the TFT/CF stack 300. Thickness estimation of the color filter will be described later in details. The organic insulator layer 332 may be formed of a photoactive compound (PAC), among other suitable material to provide a flat surface for forming more layers, such as a common electrode 308 and a pixel electrode 318 among others.

The common electrode 308 is disposed over the organic insulator layer 332 for all pixels. By connecting the third metal layer 336 to the drain electrode 324 and covering the gate 306, common electrode $V_{com}$ 308 is arranged above the color filter 314. The common electrode 308 includes both an ITO layer and the third metal layer, and has a lower resistivity than the common electrode of the conventional TFT/CF stack 200.

The pixel electrode 318 is disposed over a second passivation layer 316 that is disposed over the common electrode 308 and organic insulator layer 332. The pixel electrode 318 connects to the third metal 336 above the color filter 314 through via hole CNT2 330B and thus connects to the drain electrode 324B or source electrode 324A (not shown) through via hole CNT1 330A. The source and drain electrodes may be interchangeable.

Via holes formed in the present TFT/CF stack 300 are less deep than that of a conventional TFT/CF stack due to the presence of the third metal layer. The common electrode 308 is now arranged above the color filter layer 314, as shown in FIG. 3A, rather than below the color filter layer 214 of a conventional TFT/CF stack, i.e. common electrode 208 as shown in FIG. 2. For example, via hole CNT1 330A formed in the color filter layer of the TFT/CF stack 300 is less deep than conventional via hole CNT1 230A, as shown in FIG. 2. Via hole CNT2 330B formed in the PAC layer 332 of the TFT/CF stack 300 shown in FIGS. 3A-B may also have a shorter depth than the conventional via hole CNT2 230B, as shown in FIG. 2. Via hole CNT3 formed in the PAC layer 332 is also relatively shallow, compared to via holes 220A and 220B for the conventional TFT/CF stack 200.

Figure 3B:
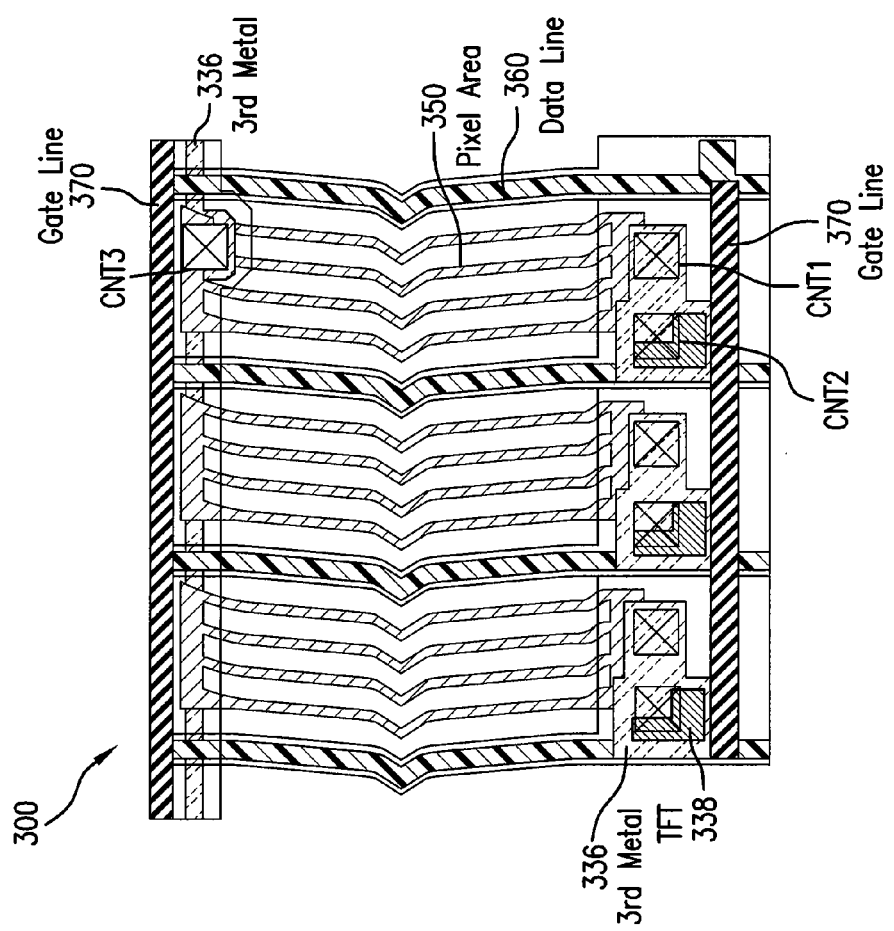
FIG. 3B shows a plan view of the TFT/CF stack of the liquid crystal display of FIG. 3A.

FIG. 3B shows a plan view of a number of pixel regions with their respective TFTs in a first embodiment. Arrows A-A in FIG. 3B illustrate where the cross-sectional view shown in FIG. 3A is taken. This cross-section permits depiction of the three via holes CNT1 330A, CNT2 330B, and CNT3 330C in one view.

The pixel region includes an active pixel area 350 (also referred to herein as an "aperture area") above a dashed line and a TFT area below the dashed line. The pixel region edges are defined by first and second data lines 360A-B and first and second gate lines 370A-B. The pixel region may be generally rectangular in shape or square in shape. Still other embodiments may have differently-shaped pixel regions.

Each gate line 370A or 370B may be connected to multiple TFTs. The first data line 360A may be connected to drain electrode 324B. The second data line 360B may be connected to a neighboring drain electrode. The first gate line 370A may be connected to gate electrode 306 for the pixel regions shown in FIG. 3B. The second gate line 370B at the bottom may be connected to the gate electrode for the pixel regions below the gate line 370B.

The TFT 338 switches a respective pixel for each active pixel area 350 on and off. Each active pixel area includes a liquid crystal layer. A voltage between the pixel electrode and the common electrode may be applied to the liquid crystal layer for each active pixel area. The voltage may control the alignment of liquid crystal molecules in the liquid crystal layer and to control light for each pixel of the LCD.

The data lines 360A-B and the gate lines 370A-B may be controlled by a controller for a LCD (not shown) to change the "on" and "off" states of the TFT. The pixel electrode 318 may be connected to the drain electrode 324B and may receive a signal from the TFT, such that a voltage between the pixel electrode 318 and the common electrode 310 may be applied to the respective pixel.

The third metal layer 336 covers the L-shaped TFT 338, via holes CNT2 330B and CNT1 330A. The TFT 338 may overlap with via hole CNT2 in a particular embodiment, although other embodiments of arrangements of CNT1 and CNT2 are provided and described below, for example, in FIGS. 7-9. As shown in FIG. 3B, the third metal layer 336 is connected to the via hole CNT3 and substantially aligned with the gate line 370 on the top, but is outside the active pixel area 350.

The via holes CNT1 330A and CNT2 330B are arranged to be in the TFT area, but beyond the aperture area or the active pixel area. The via holes CNT2 may overlap with a portion of the TFT area. The third metal layer 336 covers the TFT 338 which is illustrated as "L" shaped, via holes CNT1 and CNT2.

Figure 4:
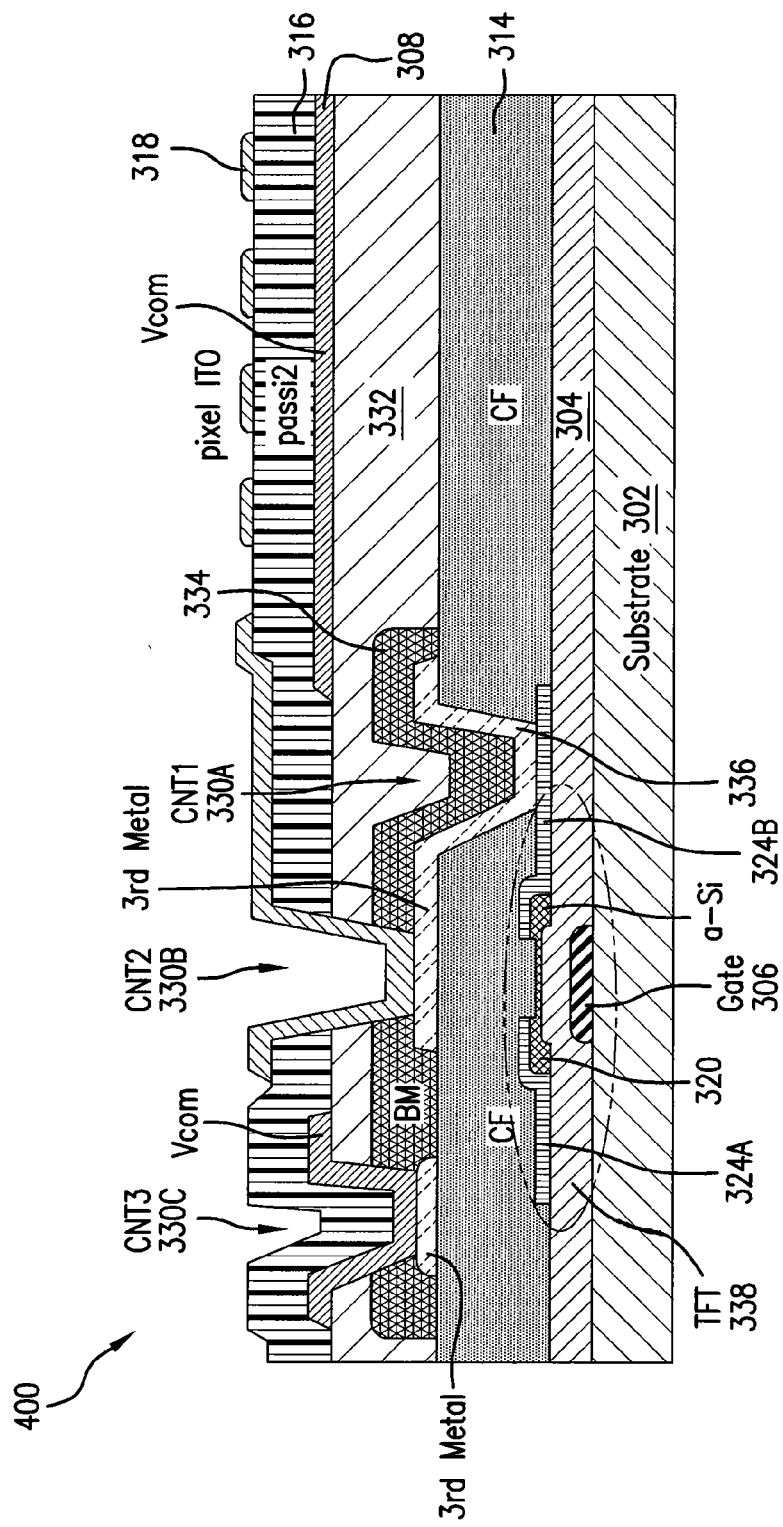
FIG. 4 shows a cross-sectional view of the TFT/CF stack of the liquid crystal display in a second embodiment of the present disclosure.

The first passivation layer 310 in TFT/CF stack 300 is optional, and may be removed. FIG. 4 shows a TFT/CF stack 400 in accordance with a second embodiment. The TFT/CF stack 500 is similar to the TFT/CF stack 300, but lacks the first passivation layer 310.

Figure 5:
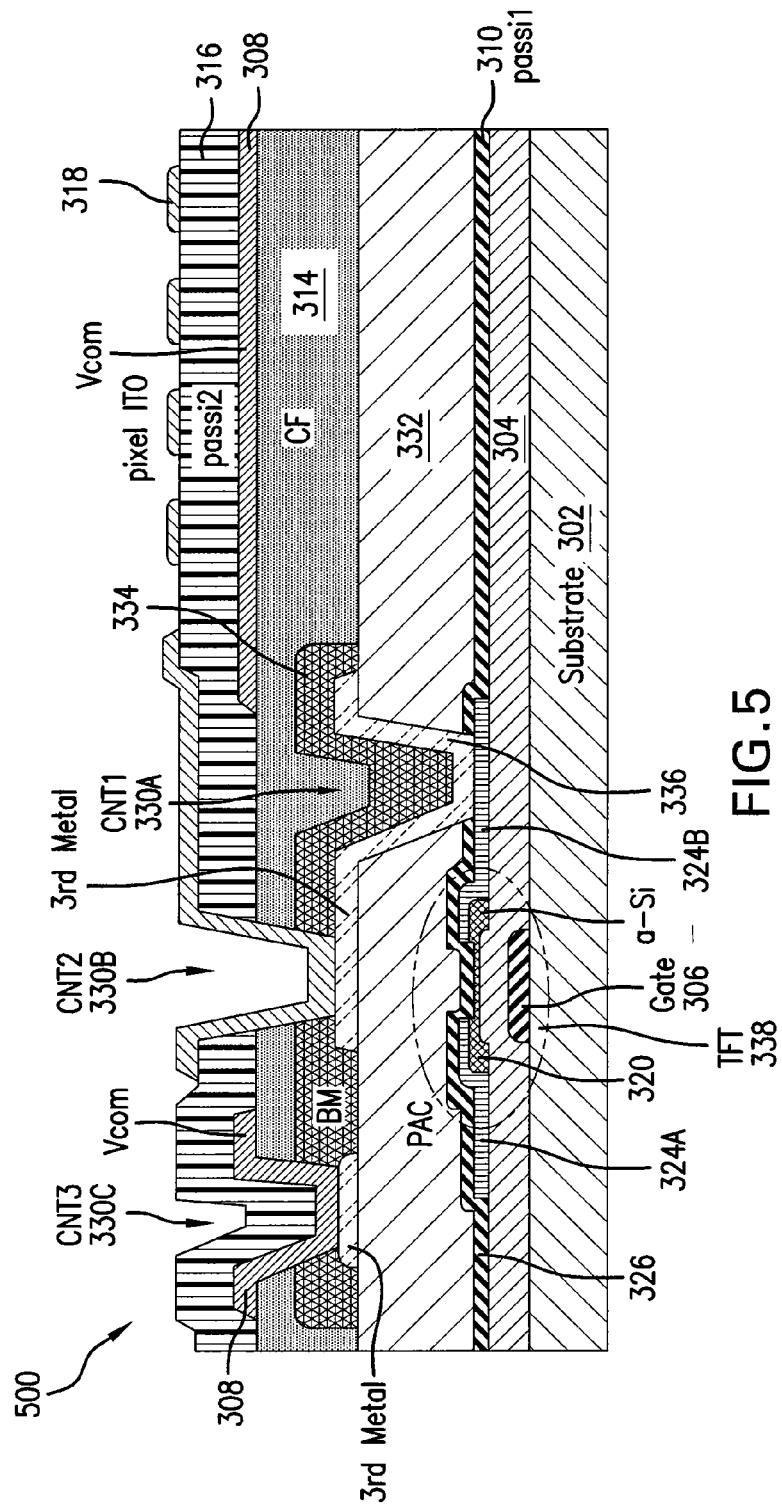
FIG. 5 shows a cross-sectional view of the TFT/CF stack of the liquid crystal display in a third embodiment of the present disclosure.

Additionally, the position of color filter layer and the PAC may be exchanged. FIG. 5 shows a cross-sectional view of the TFT/CF stack of the liquid crystal display in a third embodiment of the present disclosure. For example, TFT/CF stack 500 includes an organic insulator (OC) or PAC 332 that covers the first passivation layer 310, which is different from the TFT/CF stack 300. As shown in FIG. 5, via hole CNT1 330A is formed in the organic insulator 332. Via hole CNT2 330B is formed in the color filter layer 314 that covers the third metal layer 336. Via hole CNT3 330C is also formed in the color filter layer 314. $V_{com}$ connects to the third metal layer 336.

Figure 6:
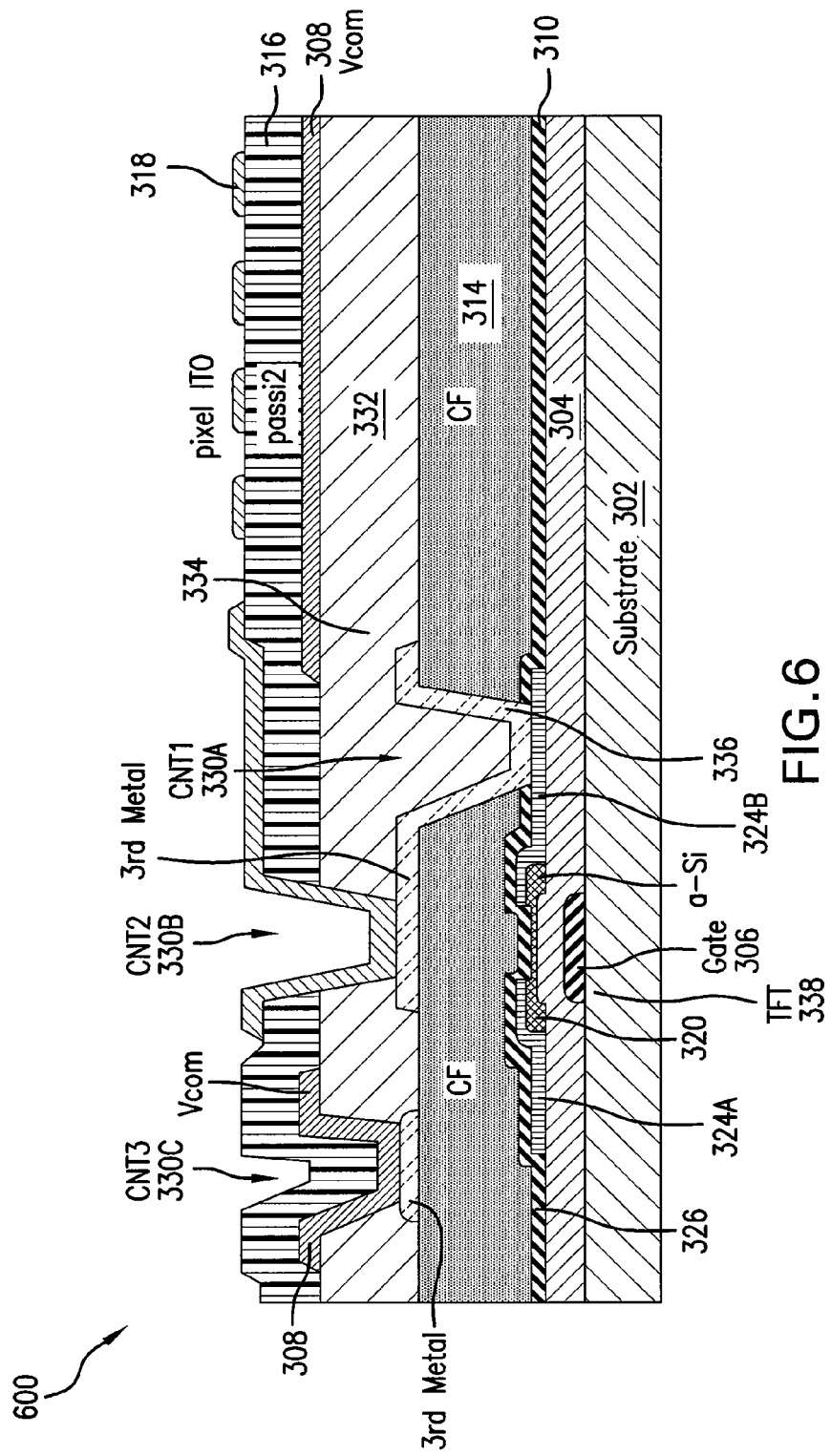
FIG. 6 shows a cross-sectional view of the TFT/CF stack of the liquid crystal display in a fourth embodiment of the present disclosure.

Additionally, the black matrix layer 334 may be removed when the third metal layer 336 is configured to remove reflection of light from the LCD panel. FIG. 6 shows a cross-sectional view of the TFT/CF stack of the liquid crystal display in a fourth embodiment of the present disclosure. As shown in FIG. 6, TFT/CF stack 600 is mostly similar to TFT/CF stack 300, but does not have the black matrix layer 334.

Figure 7:
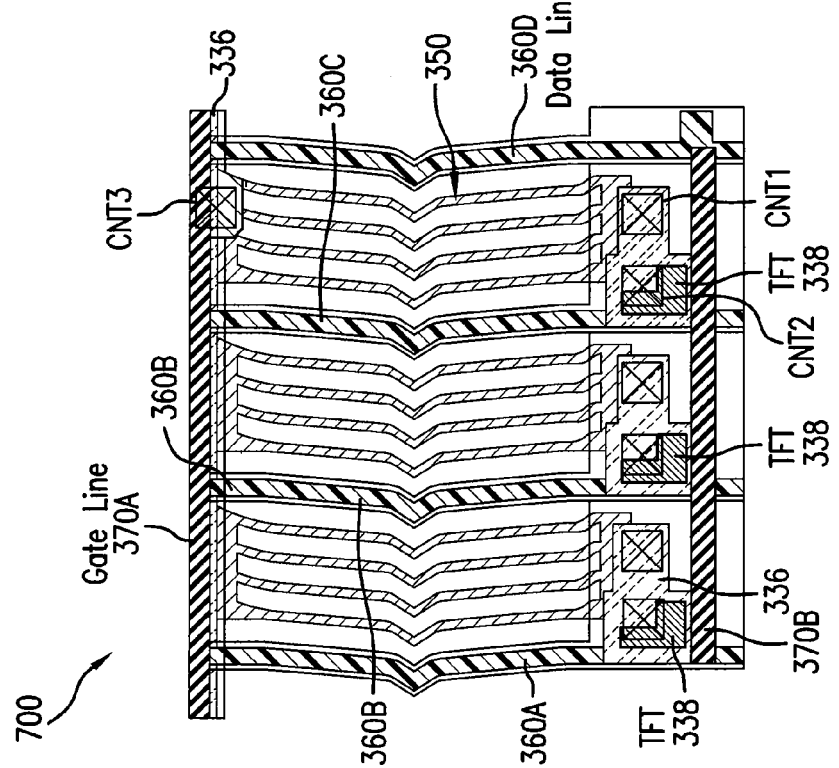
FIG. 7 shows a cross-sectional view of the TFT/CF stack of the liquid crystal display in a fifth embodiment.

Various arrangements of the via holes CNT1 and CNT2 are provided. FIG. 7 shows a plan view of the TFT/CF stack of the liquid crystal display in a fifth embodiment. As shown in the bottom of FIG. 7, via hole CNT2 may overlap with the TFT 338. As shown at the top of FIG. 7, the third metal layer 336 (connected to CNT3) may overlap with the gate line. This overlap helps expand the active pixel area, because the third metal layer when overlapping with the gate line does not occupy the active pixel area.

Figure 8:
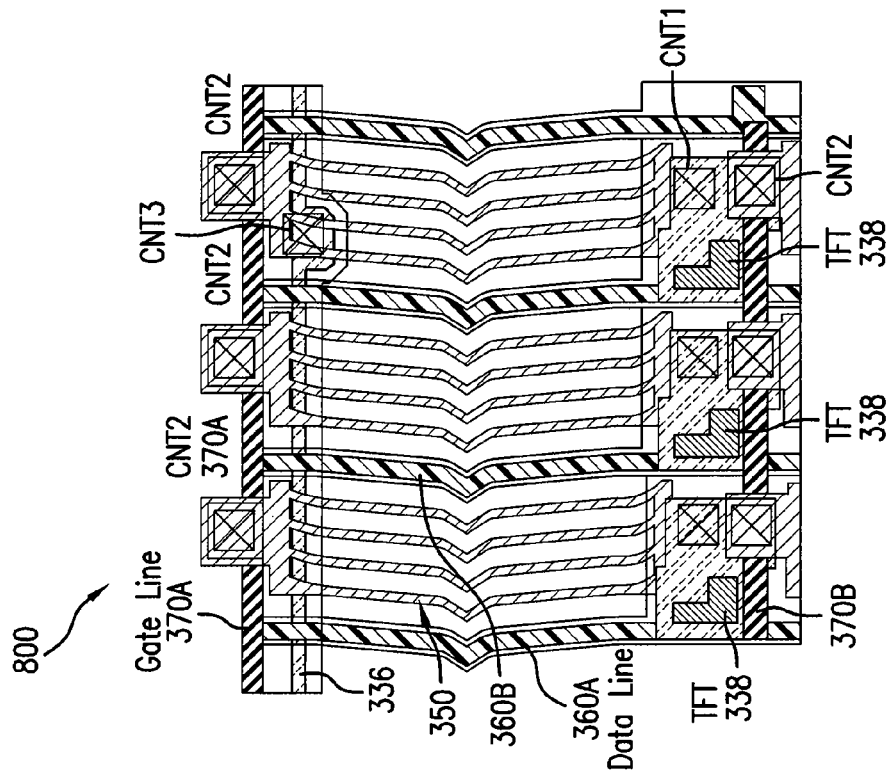
FIG. 8 shows a cross-sectional view of the TFT/CF stack of the liquid crystal display in a sixth embodiment.

FIG. 8 shows a plan view of the TFT/CF stack of the liquid crystal display in a sixth embodiment. As shown a the bottom of FIG. 8, via hole CNT2 may be on gate line and via holes CNT1 and CNT2 may be arranged to be substantially parallel to the data line. As shown at the top of FIG. 8, the third metal layer 336 does not overlap with the gate line.

Figure 9:
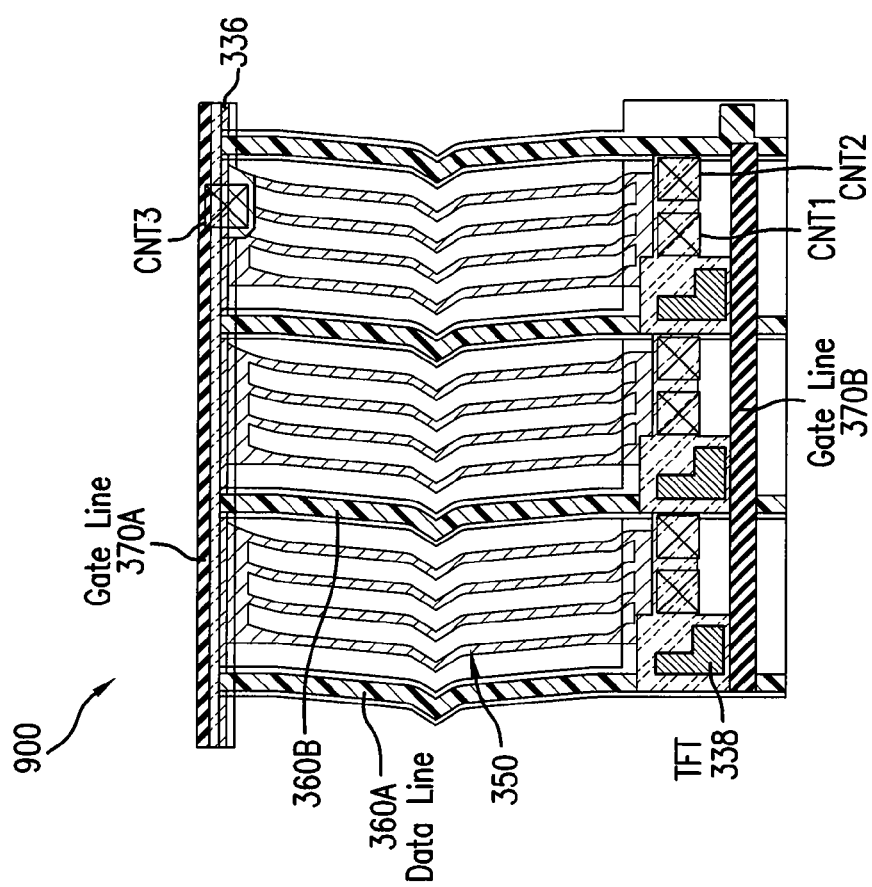
FIG. 9 shows a cross-sectional view of the TFT/CF stack of the liquid crystal display in a seventh embodiment.

FIG. 9 shows a plan view of the TFT/CF stack of the liquid crystal display in a seventh embodiment. As shown at the bottom of FIG. 9, via hole CNT2 may be formed on the data line, and via holes CNT1 and CNT2 may be arranged to be substantially parallel to the gate line. As shown at the top of FIG. 9, the third metal layer 336 may overlap with the gate line.

In the various embodiments as shown in FIGS. 3A, 4, 5, and 6, the pixel electrode 318 connects to the third metal layer through via hole CNT2, while the third metal layer 336 connects to the drain electrode 324B through via hole CNT1 330A. Each of via holes CNT1 330A, CNT2 330B, and CNT3 330C of these embodiments is shallower than the via holes CNT1 230A and CNT2 230B of a conventional design 200. The color filter layer 314 of the present embodiments is also thinner than conventional color filter layer 214.

The semiconductor layer 320 may be amorphous silicon. Alternatively, the TFT may be an oxide TFT, such as an indium-gallium-zinc oxide (IGZO) TFT.

Figure 10:
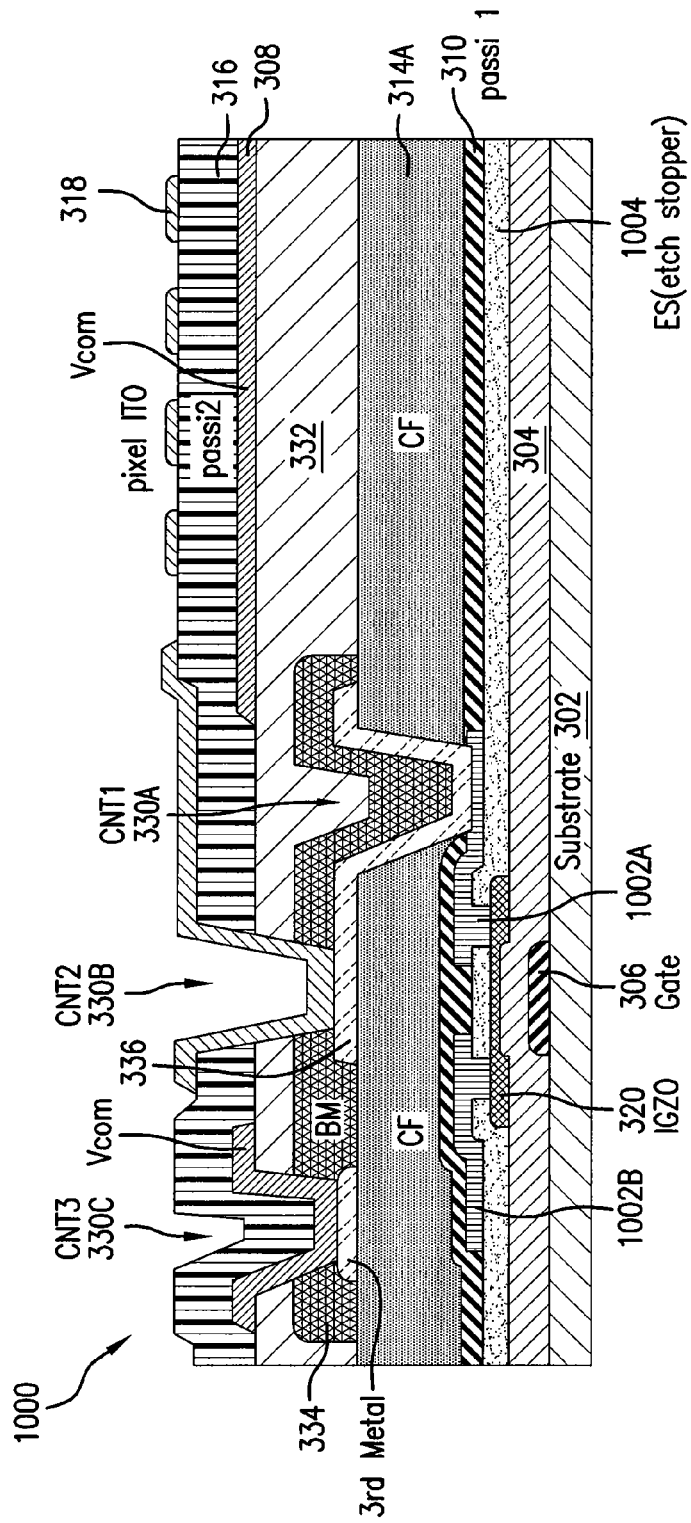
FIG. 10 shows a cross-sectional view of the TFT/CF stack of the liquid crystal display in an eighth embodiment.

FIG. 10 shows a cross-sectional view of a TFT/CF stack of the AMLCD in an eighth embodiment. Oxide TFT 1000 includes an etch-stop layer 1004 that covers the semiconductor layer 320, such as IGZO. The etch-stop layer 1004 is positioned to separate the source electrode 324A and the drain electrode 324B. The TFT/CF stack 1000 includes gate electrode 306, a source electrode 324A, a drain electrode 324B, a gate insulator 304, and a semiconductor layer 320, similar to the TFT/CF stack 300. The semiconductor layer 320 may be formed of IZGO, which is different from the TFT/CF stack 300 where the semiconductor layer 320 is formed of amorphous silicon. The semiconductor layer 320 connects to the source electrode 324A and drain electrode 324B. The TFT/CF stack 1000 further includes a first passivation layer 310, a color filter (CF) layer 314, a third metal layer 336, a black matrix layer 334, and an organic insulator 332, a common electrode 308, a pixel electrode 318, and a second passivation layer 316, similar to the TFT/CF stack 300.

Figure 11:
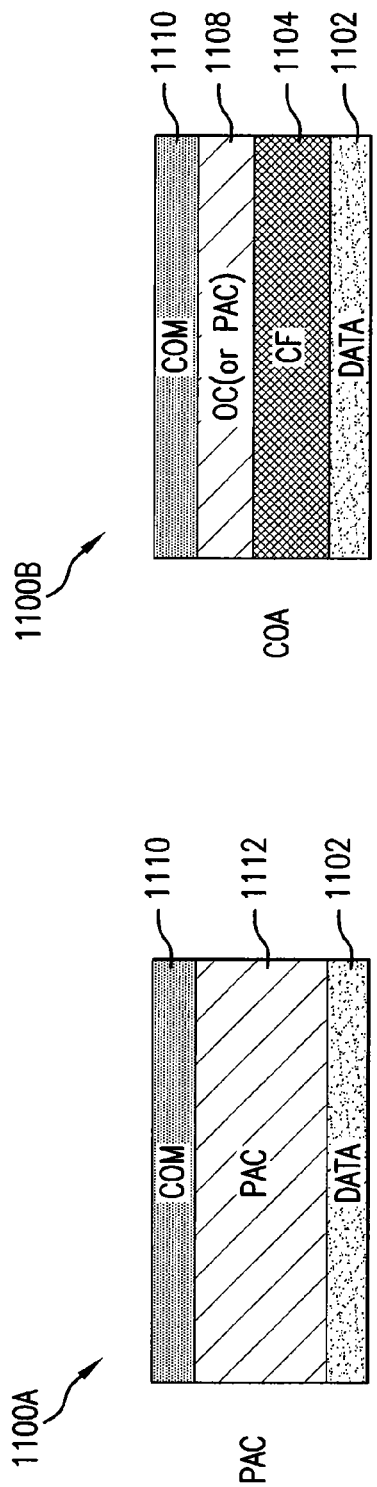
FIG. 11A shows a cross-sectional view of an example CD coupling by a photoactive compound (PAC).
FIG. 11B shows a cross-sectional view of an example CD coupling by the COA.

By including the organic insulator 332, the color filter layer 314 of the present TFT/CF stack 300 becomes thinner than that of a conventional TFT/CF stack 200. The organic insulator and the thinner color filter layer together provide equivalent CD coupling to the capacitance of the thicker color filter layer of the conventional TFT/CF stack. The thickness of the organic insulator 332 (e.g. PAC) may be estimated as follows. As shown in FIGS. 11A and 11B, the CD coupling between the common electrode and the data line is represented by Equation (1) as follows:

$$1/C_{PAC} = 1/C_{CF} + 1/C_{OC}$$ Equation (1)

where $C_{PAC}$ is the capacitance between common electrode and data line, $C_{CF}$ is the capacitance for the color filter layer, and $C_{OC}$ is the capacitance for organic insulator. Assume that the dielectric constant of the PAC is $\in$, and the dielectric constant of the color filter is $2\in$, based upon Equation (1), the thickness for each of the PAC layer, OC layer, and CF layer can be represented in Equation (2) as follows:

$$d_{PAC}/\in = d_{CF}/2\in + d_{OC}/\in$$ Equation (2)

In a particular example, assuming that $d_{PAC}$ is about 2.0 μm, $d_{CF}$ is about 2.2 μm, then $d_{OC}$ is estimated to be about 0.9 μm based upon Equation (2).

Although conventional color filter material can still be used, a lower dielectric constant for the color filter helps further reduce the CD coupling. The color filter may use transparent color polymer materials, such as polycarbonate or polyester among others.

It will be appreciated by those skilled in the art that the source and drain electrodes 324A and 324B may be interchangeable.

In a particular embodiment, the semiconductor layer may be an indium-gallium-zinc-oxide (IGZO). The IGZO may be replaced by other semiconductors. It will be appreciated by those skilled in the art that the semiconductor layer may include other materials, for example, zinc oxide (ZnO), indium oxide (InO), gallium oxide (GaO), tin oxide (SnO2), indium gallium oxide (IGO), indium zinc oxide (IZO), zinc tin oxide (ZTO), or indium zinc tin oxide (IZTO) among others.

The organic insulator layer 332 may be formed of an organic material, such as a photoactive compound (PAC), an acrylate, or an organic-inorganic hybrid like siloxane to provide a flat surface for forming more layers, including the common electrode 308 and the pixel electrode 318. Furthermore, the photoactive compound (PAC) could be positive tone or negative tone material. The polymer bases may be acrylate, cyclic olefin polymer, or siloxane among others. The PAC has a relatively low dielectric constant, considerably lower than the first and second passivation layers 310 and 316. The first passivation layer 310 and the second passivation layer 316 may be formed of a dielectric material, such as silicon nitride (g-SiNx) which has a relatively high dielectric constant.

The substrate 302 may be transparent, such as a glass substrate. The gate electrode 306, source electrode 324A, the drain electrode 324B, and the third metal layer 336 may be formed of a conductive material having low electrical resistance, such as copper or aluminum and the like. The common electrode 308 and the pixel electrode 318 may be formed of a transparent conductor, such as indium-tin oxide (ITO), indium zinc oxide (IZO) among others.

The gate insulator 304 may be formed of an inorganic insulation film including silicon oxide ($SiO_2$), silicon nitride (SiNx), a dielectric oxide film such as aluminum oxide ($Al_2O_3$), or an organic material, and the like. The gate insulator 304 may be formed by a chemical vapor deposition (CVD) method using a plasma enhanced chemical vapor deposition system or formed by a physical vapor method using a sputtering system. Other deposition processes may also or alternatively be used. The gate insulator 304 may also include multiple layers of the above materials. For example, the gate insulator 304 may include one or more passivation layers. In a particular embodiment, the gate insulator 304 may have a two-layer structure. A silicon nitride layer may be formed as a first insulating layer and a silicon oxide layer may be formed as a second insulating layer. This gate insulator 304 may prevent an impurity such as moisture or alkali metal or copper contamination from diffusing into a TFT element and a display device and may also improve reliability of a semiconductor element formed in an element formation layer, or the like.

Figure 12:
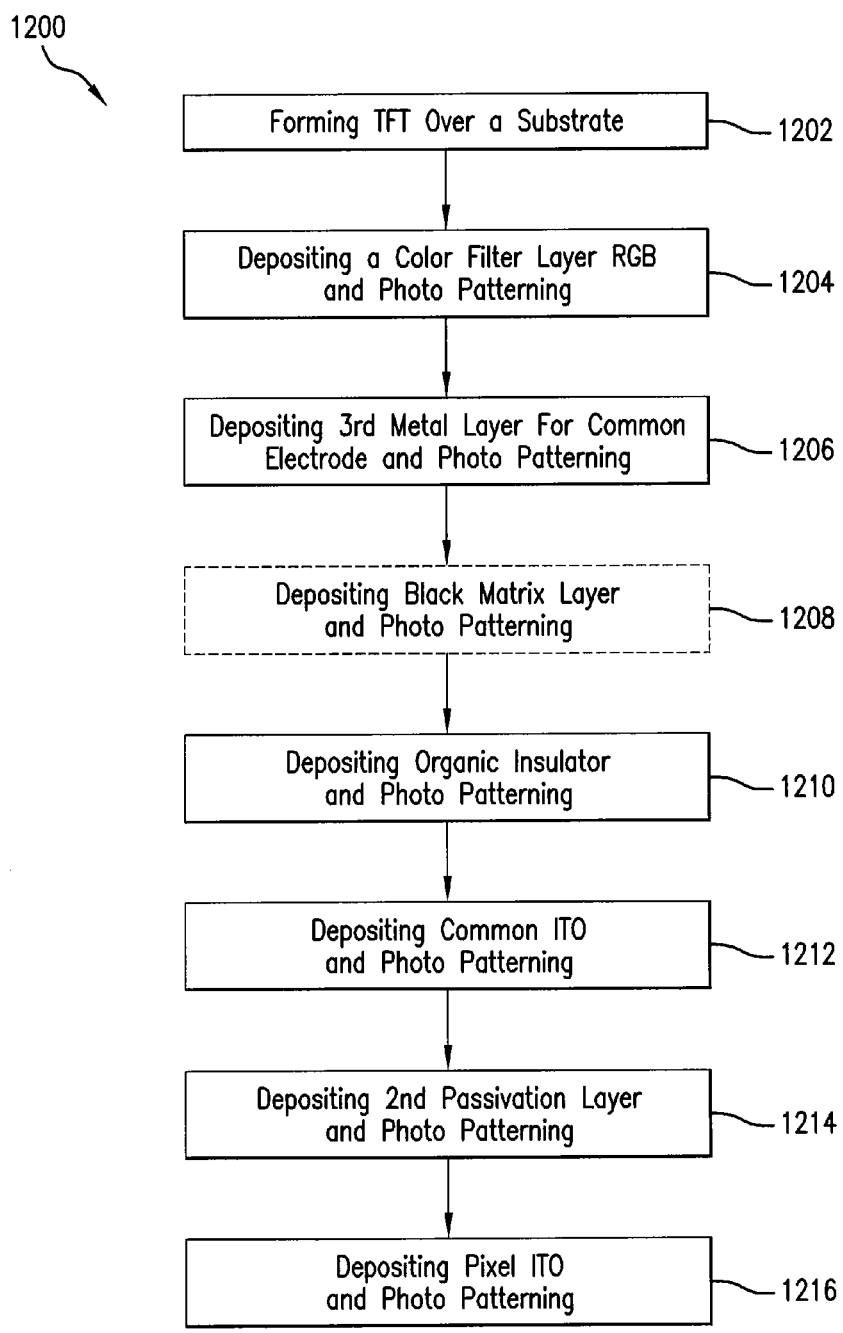
FIG. 12 is a flow chart illustrating steps for fabricating the display of FIGS. 3A-3B in accordance to embodiments of the present disclosure.

The disclosure also provides methods for fabricating the color filter array (COA) with back channel etching (BCE). FIG. 12 is a flow chart illustrating steps for fabricating the display of FIGS. 3A-3B in accordance with embodiments of the present disclosure. Method 1200 starts with forming a TFT over a substrate at operation 1202. The operation of forming the TFT may include gate metal deposition and photo patterning, gate insulate deposition, semiconductor deposition, source/drain metal deposition and photo patterning, and optional deposition of a first passviation layer. The operation of forming the TFT may optionally include active back channel etching prior to deposition of the first passivation layer.

For forming the TFT, it may require up to five masks. For example, in the case of forming the TFT according to the first embodiment, at most four masks are used for the depositions of the gate metal, the gate insulator, the semiconductor layer and the source/drain metal as well as the first passivation layer with respective photo patterning.

In the case of forming the TFT according to the second embodiment without the first passivation layer, at most three masks may be used for the depositions of the gate metal, the gate insulator, the semiconductor layer or active layer, the source/drain metal and the respective photo patterning as well as active back channel etching. The number of masks is reduced because the first passivation layer is not present in this embodiment.

In the case of forming the TFT according to the third embodiment where the color filter and the organic insulator are exchanged, at most four masks may be used for depositions of the gate metal, the gate insulator, the active layer, and the source/drain metal with respective photo patterning, for active back channel photo etching and deposition of the first passivation layer and photo patterning.

In the case of forming the oxide TFT with an etch-stop layer according to the eighth embodiment, at most five masks may be used for the depositions of the gate metal, gate insulator, active layer, etch-stop layer, source/drain/metal layer, and the first passivation layer with their respective photo patterning. An additional mask is needed for the deposition of the etch-stop layer.

The method 1200 continues with depositing color filter such as red-green-blue (RGB) color filters and patterning at operation 1204, followed by depositing the third metal layer for common electrode and photo patterning at operation 1206. The method 1200 also includes depositing a black matrix layer and photo patterning, which may be an optional operation (as shown in dash line) 1208. The method 1200 further includes depositing organic insulator layer and photo patterning at operation 1210, depositing common ITO and photo patterning at operation 1212, depositing a second passivation layer and photo patterning at 1214, and depositing pixel ITO and photo patterning at operation 1216.

For photo patterning or lithography, a photoresist is first deposited on a surface, and then light is selectively passed through a patterned mask that may block light in certain areas. The exposed photoresist film is developed through the patterned mask to form the photoresist patterns as shown. The exposed photoresist film protects the layers underneath during an etching process, such that the portion exposed by the photoresist may be completely removed by the etching process, such as a wet etching. Portions of underlying layers that are protected by photoresist generally are not removed or otherwise etched. After etching to form a pattern of a deposited layer by using photoresist, the insoluble photoresist is removed prior to the next deposition operation. Different masks may be provided to form various films with different patterns. In alternative embodiments, different photoresist may be used.

The photoresist film may be made of a photosensitive material; exposure to light (or particular wavelengths of light) to develop the photoresist. The developed photoresist may be insoluble or soluble to a developer. There may be two types of photoresist, a positive photoresist and a negative photoresist. The positive photoresist is soluble to the photoresist developer. The portion of the positive photoresist that is unexposed remains insoluble to the photoresist developer. The negative resist is a type of photoresist in which the portion of the photoresist that is exposed to light becomes insoluble to the photoresist developer. The unexposed portion of the photoresist is dissolved by the photoresist developer.

Figure 13:
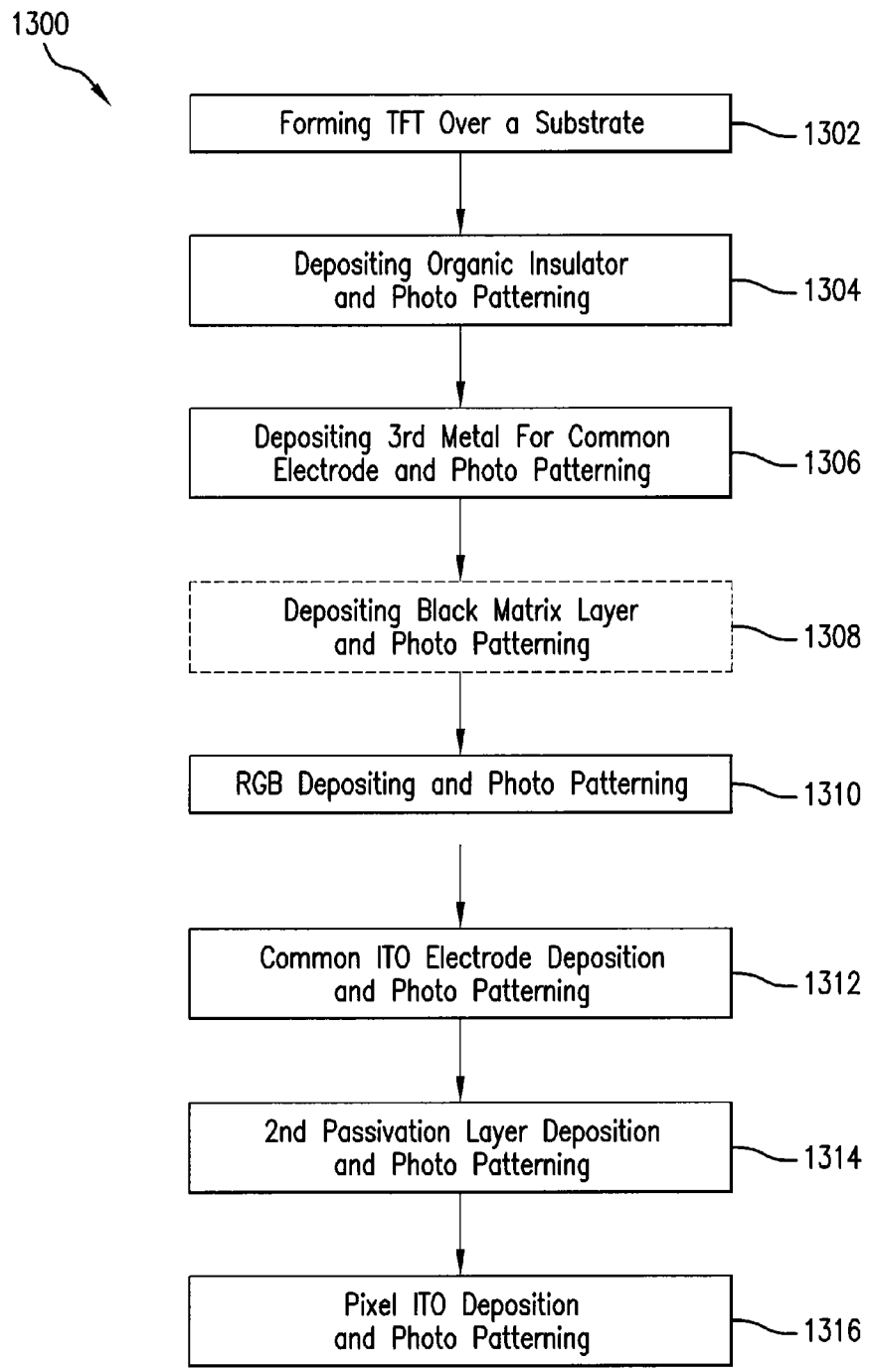
FIG. 13 is a flow chart illustrating steps for fabricating the display of FIG. 5 in accordance to embodiments of the present disclosure.

FIG. 13 is a flow chart illustrating steps for fabricating the display of FIG. 5 in accordance to embodiments of the present disclosure. Method 1300 starts with forming a TFT over a substrate at operation 1302. The method 1300 continues with depositing organic insulator and patterning at operation 1304, followed by depositing the third metal layer for common electrode and photo patterning at operation 1306. The method 1300 also includes depositing a black matrix layer and photo patterning, which may be an optional operation (as shown in dash line) 1308. The method 1300 further includes depositing RGB color filter layer and photo patterning at operation 1310, depositing common ITO and photo patterning at operation 1312, depositing a second passivation layer and photo patterning at 1314, and depositing pixel ITO and photo patterning at operation 1316.

The process architecture of the present disclosure provides several benefits over of the conventional COA technology. The benefits include (A) increasing optical transmittance by reducing via hole sizes, and re-arranging the TFT beyond the pixel region compared to the conventional design; (B) simplifying the process by eliminating the operation of the alignment between the COA and TFT due to thinner COA; (C) minimizing color mixing from inter-pixel optical interference for high resolution display by using black matrix on the bottom glass substrate and also low misalignment between pixel and the color filter; (D) reducing CD coupling between data line or data signal and common electrode/pixel electrode by adding the organic passivation layer. Although conventional color filter material with high dielectric constant may still be used, other color filter materials with lower dielectric constant are desirable to further help reduce the CD coupling.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method for fabricating an active matrix liquid crystal display, the method comprising:
    forming a thin film transistor (TFT) over a substrate, the TFT having a gate electrode, a source electrode overlapping with a first area of the gate electrode, and a drain electrode overlapping with a second area with the gate electrode;
    depositing a color filter layer over the TFT, the color filter having at least a first via hole to expose a portion of the drain electrode;

forming a metal layer over the color filter, the metal layer filling the first via hole to connect to the drain electrode;

depositing a black matrix over the metal layer;

depositing an organic insulator layer over the black matrix layer such that at least a portion of the black matrix layer is interposed between the organic insulator layer and the metal layer, the organic insulator layer having a second via hole to expose a first portion of the metal layer and a third via hole to expose a second portion of the metal layer;

forming a common electrode over the organic insulator, the common electrode being connected to the metal layer through the third via hole;

depositing a first passivation layer over the common electrode, the second via hole being through the first passivation layer; and forming a pixel electrode over the first passivation layer, the pixel electrode being connected to the metal layer through the second via hole.

2. The method of claim 1, wherein each of the gate electrode, the source electrode, the drain electrode, and the metal layer comprises one or more layers of a conductive material selected from a group consisting of copper, copper alloy, aluminum, aluminum alloy, titanium, and molybdenum.

3. The method of claim 1, the step of forming a TFT further comprising forming a semiconductor layer between the gate electrode and the source/drain electrodes, and forming a gate insulator layer between the gate electrode and the semiconductor layer.

4. The method of claim 3, wherein the semiconductor layer comprises an oxide semiconductor selected from a group consisting of indium-gallium-zinc-oxide (IGZO), zinc oxide (ZnO), indium oxide (InO), gallium oxide (GaO), tin oxide (SnO2), indium gallium oxide (IGO), indium zinc oxide (IZO), zinc tin oxide (ZTO), and indium zinc tin oxide (IZTO).

5. The method of claim 3, the step of forming a TFT further comprising depositing an etch-stop layer that covers at least a portion of the semiconductor layer and is under at least a portion of the source/drain electrodes.

6. The method of claim 3, wherein the semiconductor layer comprises amorphous silicon.

7. The method of claim 1, wherein the gate insulator comprises one or more layers of one or more dielectric materials, each material being selected from a group consisting of silicon oxide ($SiO_2$), silicon nitride ($SiN_x$), aluminum oxide ($Al_2O_3$), and organic material.

8. The method of claim 1, further comprising depositing a second passivation layer over the TFT prior to depositing the color filter layer.

9. The method of claim 8, wherein each of the first and second passivation layers comprises a material selected from a group consisting of silicon oxide and aluminum oxide.

10. The method of claim 1, wherein the substrate comprises a glass.

11. The method of claim 1, wherein the organic insulator layer comprises a photoactive compound (PAC).

12. The method of claim 1, wherein each of the common electrode and the pixel electrode comprises indium-tin oxide (ITO).

13. A method for fabricating an active matrix liquid crystal display, the method comprising:

forming a thin film transistor (TFT) over a substrate, the TFT having a gate electrode, a source electrode overlapping with a first area of the gate electrode, and a drain electrode overlapping with a second area with the gate electrode;

depositing an organic insulator over the TFT, the organic insulator having a first via hole to expose a portion of the drain electrode;

forming a metal layer over the organic insulator, the metal layer filling the first via hole;

depositing a color filter layer over the metal layer, the color filter having a second via hole to expose a first portion of the metal layer and a third via hole to expose a second portion of the metal layer;

forming a common electrode over the color filter layer, the common electrode being connected to the metal layer through the third via hole;

depositing a first passivation layer over the common electrode, the second via hole being through the first passivation layer; and forming a pixel electrode over the first passivation layer, the pixel electrode being connected to the metal layer through the second via hole.

14. The method of claim 13, further comprising depositing a second passivation layer between the TFT and the color filter layer.

15. The method of claim 13, further comprising depositing a black matrix layer over the metal layer, the black matrix layer configured to block light reflection from the metal layer.

16. The method of claim 13, further comprising arranging the TFT outside an active pixel region of the display.

17. The method of claim 13, further comprising arranging the first, second and third via holes outside an active region of the display.

18. An active matrix liquid crystal display having an array of pixels, the display comprising:

a thin film transistor (TFT) for each pixel, the TFT having a gate electrode, a source electrode overlapping with a first area of the gate electrode, and a drain electrode overlapping with a second area with the gate electrode;

a color filter layer disposed over the TFT, the color filter layer having a first via hole to expose a portion of the drain electrode;

a metal layer disposed over the color filter layer and covering the gate electrode, the metal layer configured to connect to the drain electrode through the first via hole;

an organic insulator layer disposed over the metal layer, the organic insulator layer having a second via hole to expose a first portion of the metal layer and a third via hole to expose a second portion of the metal layer; and a black matrix layer interposed between the metal layer and the organic insulator layer.

19. The display of claim 18, further comprising:

a common electrode disposed over the organic insulator layer, the common electrode configured to connect to the metal layer through the third via hole;

a first passivation layer disposed over the common electrode, the first passivation layer having a second via hole aligned with the second via hole of the organic insulator layer; and a pixel electrode disposed over the first passivation layer, the pixel electrode configured to connect to the metal layer in the second via hole through the organic insulator layer and the first passivation layer.

20. The display of claim 19, wherein the display further comprises a second passivation layer between the TFT and color filter layer.

21. The display of claim 20, wherein each of the first and second passivation layers comprises silicon oxide or aluminum oxide.

22. The display of claim 18, wherein the TFT further comprises a semiconductor layer between the gate electrode and the source/drain electrodes and a gate insulator layer between the gate electrode and the semiconductor layer.

23. The display of claim 22, wherein the semiconductor layer comprises an oxide semiconductor selected from a group consisting of indium-gallium-zinc-oxide (IGZO), zinc oxide (ZnO), indium oxide (InO), gallium oxide (GaO), tin oxide ($SnO_2$), indium gallium oxide (IGO), indium zinc oxide (IZO), zinc tin oxide (ZTO), and indium zinc tin oxide (IZTO).

24. The display of claim 23, wherein the TFT further comprises an etch-stop layer between at least a portion of the semiconductor layer and a portion of the source/drain electrodes.

25. The display of claim 22, wherein the semiconductor layer comprises amorphous silicon.

26. The display of claim 22, wherein the semiconductor layer comprises a material selected from a group consisting of amorphous silicon, indium-gallium-zinc-oxide (IGZO), zinc oxide (ZnO), indium oxide (InO), gallium oxide (GaO), tin oxide (SnO2), indium gallium oxide (IGO), indium zinc oxide (IZO), zinc tin oxide (ZTO), and indium zinc tin oxide (IZTO).

27. The display of claim 22, wherein the gate insulator comprises one or more layers of one or more dielectric materials, each material being selected from a group consisting of silicon oxide ($SiO_2$), silicon nitride ($SiN_x$), aluminum oxide ($Al_2O_3$), and organic material.

28. The display of claim 18, wherein the organic insulator layer comprises a photoactive compound.

29. The display of claim 18, wherein the metal layer is configured to minimize light reflection.

30. The display of claim 18, wherein the black matrix layer is configured to block light reflection from the metal layer.

31. The display of claim 18, wherein the TFT is configured to be outside an active pixel region of the display.

32. The display of claim 18, wherein each of the first, second, and third via holes is configured to be outside an active pixel region of the display.

33. The display of claim 18, wherein the color filter layer has a dielectric constant higher than the organic insulator layer.

34. The display of claim 18, wherein each of the color filter layer and the organic insulator layer has a thickness less than 2.5 μm.

35. The display of claim 18, wherein each of the gate electrode, the source electrode, the drain electrode, and the metal layer comprises one or more layers of a conductive material selected from a group consisting of copper, copper alloy, aluminum, aluminum alloy, titanium, and molybdenum.

36. The display of claim 18, wherein the substrate comprises a glass.

37. An active matrix liquid crystal display having an array of pixels, the display comprising:
   a thin-film transistor (TFT) for each pixel, the TFT having a gate electrode, a source electrode overlapping a first area with the gate electrode, and a drain electrode overlapping with a second area with the gate electrode;
   an organic insulator layer disposed over the TFT, the organic insulator layer having a first via hole to expose a portion of the drain electrode;
   a metal layer disposed over the organic insulator layer and covering the gate electrode, the metal layer configured to connect to the drain electrode through the first via hole; and
   a color filter layer disposed over the metal layer, the color filter layer having a second via hole to expose a portion of the metal layer and a third via hole to expose a second portion of the metal layer.

38. The display of claim 37, further comprises a common electrode disposed over the color filter layer, the common electrode configured to connect to the metal layer through the third via hole;
   a first passivation layer disposed over the common electrode, the first passivation layer having a second via hole aligned with the second via hole of the color filter layer; and
   a pixel electrode disposed over the first passivation layer, the pixel electrode configured to connect to the metal layer in the second via hole through the color filter layer and the first passivation layer.

39. The display of claim 37, wherein the display further comprises a second passivation layer between the TFT and organic insulator layer.

40. The display of claim 37, further comprising a black matrix layer disposed over the metal layer, the black matrix layer configured to block light reflection from the metal layer.

41. The display of claim 37, wherein the TFT is configured to be outside an active pixel region of the display.

42. The display of claim 37, wherein each of the first, second, and third via holes is configured to be outside an active pixel region of the display.

* * * * *